(12) United States Patent
Qian et al.

(10) Patent No.: US 11,119,131 B2
(45) Date of Patent: Sep. 14, 2021

(54) METHOD FOR ESTIMATING OPTIMAL EFFICIENCY POINT PARAMETERS AND PERFORMANCE CURVE IN AXIAL-FLOW PAT POWER GENERATION MODE

(71) Applicant: WUHAN UNIVERSITY, Wuhan (CN)

(72) Inventors: Zhongdong Qian, Wuhan (CN); Fan Wang, Wuhan (CN); Jing Dong, Wuhan (CN); Zehao Li, Wuhan (CN); Zhiwei Guo, Wuhan (CN)

(73) Assignee: Wuhan University, Wuhan (CN)

( * ) Notice: Subject to any disclaimer, the term of this patent is extended or adjusted under 35 U.S.C. 154(b) by 0 days.

(21) Appl. No.: 16/631,573

(22) PCT Filed: Jun. 11, 2018

(86) PCT No.: PCT/CN2018/090714
§ 371 (c)(1),
(2) Date: Jan. 16, 2020

(87) PCT Pub. No.: WO2019/136921
PCT Pub. Date: Jul. 18, 2019

(65) Prior Publication Data
US 2020/0200807 A1 Jun. 25, 2020

(30) Foreign Application Priority Data
Jan. 15, 2018 (CN) .......................... 201810037215.9

(51) Int. Cl.
*G01R 21/133* (2006.01)
*G01R 31/40* (2020.01)
*F03B 13/00* (2006.01)

(52) U.S. Cl.
CPC ............ *G01R 21/133* (2013.01); *F03B 13/00* (2013.01); *G01R 31/40* (2013.01)

(58) Field of Classification Search
CPC .......... F03B 13/00; F03B 3/103; F03B 3/126; F04D 15/0088; F05B 2220/20; F05B 2260/821; G01R 21/133; G01R 31/40
(Continued)

(56) References Cited

U.S. PATENT DOCUMENTS

| | | | | |
|---|---|---|---|---|
| 6,260,004 B1* | 7/2001 | Hays | ................... | F04D 15/0088 702/183 |
| 6,330,525 B1* | 12/2001 | Hays | ................... | F04D 15/0088 702/183 |
| 2019/0265387 A1* | 8/2019 | Tyagi | .................... | F03B 17/061 |

FOREIGN PATENT DOCUMENTS

| | | |
|---|---|---|
| CN | 103593508 A | 2/2014 |
| CN | 103870709 A | 6/2014 |

(Continued)

*Primary Examiner* — John H Le
(74) *Attorney, Agent, or Firm* — Rimon PC (57) ABSTRACT

Provided is a method for estimating optimal efficiency point parameters in an axial-flow PAT power generation mode, including: I1, calculating an axial velocity of an optimal efficiency point; I2, calculating a flow rate of the optimal efficiency point; I3, calculating a theoretical hydraulic head; I4, calculating a frictional hydraulic head loss and a local hydraulic head loss of each segment; I5, calculating an output power of the optimal efficiency point; I6, calculating a hydraulic head of the optimal efficiency point in a power generation mode; and I7, calculating an optimal efficiency. Further provided is a method for estimating a performance curve in an axial-flow PAT power generation mode based on the above method for estimating an optimal efficiency point parameter, including: II1, calculating a normalized flow-hydraulic head curve; II2, calculating a normalized hydraulic head-output power curve; and II3, calculating a hydraulic head-efficiency curve.

2 Claims, 5 Drawing Sheets

(58) Field of Classification Search
USPC .................................................. 702/60, 183
See application file for complete search history.

(56) References Cited

FOREIGN PATENT DOCUMENTS

| | | |
|---|---|---|
| CN | 104933222 A | 9/2015 |
| CN | 105804913 A | 7/2016 |
| CN | 107076162 A | 8/2017 |
| JP | H09317623 A | 12/1997 |

* cited by examiner

METHOD FOR ESTIMATING OPTIMAL EFFICIENCY POINT PARAMETERS AND PERFORMANCE CURVE IN AXIAL-FLOW PAT POWER GENERATION MODE

RELATED APPLICATIONS

This application is a national stage application of PCT/CN2018/090714 filed Jun. 11, 2018, which claims the benefit of priority from Chinese Application No. 201810037215.9 filed Jan. 15, 2018, the disclosures of both applications being incorporated herein by reference in their entirety.

TECHNICAL FIELD

The present invention belongs to the field of micro-hydropower technology, and specifically relates to a method for estimating the optimal efficiency point parameters and performance curve in an axial-flow Pump as turbine (PAT) power generation mode based on related parameters.

BACKGROUND

Based on data of the international energy agency, the total primary energy consumption is increasing rapidly in recent decades, and the gap of energy supply and demand is increasing day by day. For national and social sustainable development, it is very necessary to develop and utilize the renewable energy resource, where the waterpower resource as a green and environmentally friendly energy source still has a huge technical development potential in the world. It can be seen from the hydropower development process: the current development level of large and medium-sized hydropower stations is high and tend to be stable in developed nations and partial newly-emerging nations, and development of the hydropower resource is gradually transformed from the large-medium-sized hydropower stations to small-micro hydropower stations.

A micro hydropower station is a hydropower system with an installed capacity less than 100 kW, and can be flexibly established in any water system with surplus energy according to the demand. PAT is a currently most-effective manner to reduce all costs and shorten the investment payback period, which has attracted the attention of many international scholars. Compared with the traditional turbine, the PAT has the characteristics of low price, high standardization and serialization, simple and convenient installation, and easy accessibility of spare parts. These characteristics reduce the comprehensive cost of the PAT and make up for the disadvantage of low efficiency of PAT compared with the traditional turbine to a certain extent. However, manufacturers generally do not test performance of the PAT in a power generation mode, so an optimal efficiency point and a characteristic curve of the PAT are unknown, which causes model selection difficulty during actual application.

Currently, the prediction of hydropower characteristic of an axial-flow PAT power generation mode mainly depends on model test or three-dimensional CFD numerical simulation. These two methods have high reliability and accuracy, but their disadvantages are also obvious. The model test needs a large amount of manpower and resources, and the debugging and installing period of a test platform and test equipment is long. The numerical simulation has high requirements on theory and experience of engineers, and takes a long time. Therefore, these two methods are difficult to be popularized and applied in engineering practice.

In conclusion, there is a lack of a simple, convenient and feasible method for estimating the optimal efficiency point parameters and performance curve in an axial-flow PAT power generation mode to meet the needs of unit selection in engineering practice.

SUMMARY

In order to solve the above problem, the present invention is to provide a method for estimating optimal efficiency point parameters and performance curve in an axial-flow PAT power generation mode, which is simple, convenient and feasible, has a short calculation period, and also has great prediction accuracy in a normal operation range of a PAT.

To achieve the above objective, the present invention adopts the following solutions:

Optimal efficiency point parameters estimation method

The present invention provides a method for estimating optimal efficiency point parameters in an axial-flow PAT power generation mode, where the method includes the following steps: I1, calculating an axial velocity $v_{m1,t}$ of an optimal efficiency point in a power generation mode by utilizing the following formula:

$$v_{m1,t} = \frac{1}{\cot\beta_{e,g} + \cot\left(2\beta_e - \arctan\left(\frac{Q_{pb}}{\frac{\pi}{4}(D^2 - d_h^2)}\frac{60}{2\pi nR}\right)\right)} \frac{2\pi n}{60} R,$$

where $v_{m1,t}$ is an axial component of an absolute velocity (m/s), $Q_{pb}$ is an flow rate of an optimal efficiency point in a pumping mode (m³/s), R is a radius of an airfoil position (m), n is a rotational velocity of an impeller (r/min), D is impeller diameter (m), $d_h$ is a diameter of a hub (m), $\beta_e$ is an impeller airfoil setting angle(°), and $\beta_{e,g}$ is a guide blade setting angle (°);

I2, calculating a flow rate $Q_{tb}$ of the optimal efficiency point in the power generation mode based on the axial velocity and flow area of the optimal efficiency point:

$$Q_{tb} = \frac{\pi}{4}(D^2 - d_h^2)v_{m1,t},$$

where $Q_{tb}$ is the flow rate of the optimal efficiency point in the power generation mode (m³/s);

I3, calculating a theoretical hydraulic head $H_{t,th}$ of an axial-flow PAT:

$$H_{t,th} = \frac{u_{1,t}v_{u1,t}}{g},$$

where $u_{1,t}$ a circumferential velocity (m/s), $v_{u1,t}$ is a circumferential component of the absolute velocity (m/s), and g is a gravitational acceleration (m/s²);

I4, segmenting a whole flow channel of the axial-flow PAT according to geometrical characteristics, and respectively calculating a frictional hydraulic head loss and a local hydraulic head loss of each segment according to formulas listed in Table 1:

TABLE 1

Formulas for calculating a frictional hydraulic head loss and a local hydraulic head loss of each segment

| Flow passage component | Frictional hydraulic head loss | Local hydraulic head loss |
|---|---|---|
| Elbow pipe | $h_{f,e} = \lambda_{f,e} \dfrac{\theta_e \pi}{360} \cdot \dfrac{r_e}{r_{0,e}} \cdot \dfrac{v_e^2}{2g}$ | $h_{d,e} = \left[0.131 + 1.847\left(\dfrac{r_{0,e}}{r_e}\right)^{3.5}\right]\left(\dfrac{\theta_e}{90}\right)\dfrac{v_e^2}{2g}$ |
| Reductive pipe | $h_{f,s} = \lambda_{f,s} \dfrac{1}{8\sin(\theta_s/2)} \cdot \left[1 - \left(\dfrac{A_{s2}}{A_{s1}}\right)^2\right] \cdot \dfrac{v_{s2}^2}{2g}$ | $h_{d,s} = \xi_s \dfrac{v_{s2}^2}{2g}$ |
| Guide blade zone | $h_{f,g} = Z_g \lambda_g \dfrac{l_{b,g}}{D_{hyd,g}} \dfrac{\overline{w}_g^2}{2g}$ | $h_{shock,g} = 0.7 \dfrac{w_{i,g}^2}{2g}$ |
| | | $h_{wake,g} = (1 - \xi_g)^2 \dfrac{\overline{w}_g^2}{2g}$ |
| Impeller zone | $h_f = Z\lambda \dfrac{l_b}{D_{hyd}} \dfrac{\overline{w}^2}{2g}$ | $h_{shock} = 0.7 \dfrac{w_i^2}{2g}$ |
| | | $h_{wake} = (1 - \xi)^2 \dfrac{\overline{w}^2}{2g}$ |
| Diffuser | $h_{f,d} = \lambda_{f,d} \dfrac{1}{8\sin(\theta_d/2)} \cdot \left[\left(\dfrac{A_{d2}}{A_{d1}}\right)^2 - 1\right] \cdot \dfrac{v_{d2}^2}{2g}$ | $h_{d,d} = k\left(\dfrac{A_{d2}}{A_{d1}} - 1\right)^2 \cdot \dfrac{v_{d2}^2}{2g}$ | where $\lambda_{f,e}$ is a hydraulic frictional resistance coefficient of the elbow pipe, $\theta_e$ is a bend angle of the elbow pipe (°), $r_e$ is ea radius of the elbow center line (m), $r_{0,e}$ is a radius of the elbow pipe (m), $v_e$ is an average flow velocity of the elbow pipe (m/s), $f_{f,s}$ is a hydraulic frictional resistance coefficient, $\theta_s$ is a convergence angle (°), $A_{s1}$ and $A_{s2}$ are a flow area of an inlet of the reductive pipe and a flow area of an outlet of the reductive pipe (m2) respectively, $v_{s1}$ and $v_{s2}$ respectively are an average flow velocity of the inlet of the reductive pipe and an average flow velocity of the outlet of the reductive pipe (m/s), $\xi_s$ is a local loss coefficient and is determined by the size of the convergence angle, $h_f$ is a frictional hydraulic head loss (friction loss) in an impeller flow channel (m), Z is the number of impeller blades, $\lambda$ is a hydraulic frictional resistance coefficient, $l_b$ is a length of the impeller flow channel and can be calculated approximately according to an airfoil chord length (m), $D_{hyd}$ is an equivalent hydraulic diameter of the impeller flow channel (m), is an average relative velocity of the impeller flow channel:

$$\overline{w} = \sqrt{\dfrac{(w_{1',p}^2 + w_{2',p}^2)}{2}},$$

$w_{1',p}$ is a relative velocity of a blade inlet (m/s), $w_{2',p}$ is a relative velocity of a blade outlet (m/s), $h_{shock}$ is a fluid shock loss of the blade inlet (m), $w_i$ is a fluid shock velocity of the blade inlet, that is a component of the relative velocity in an airfoil vertical direction (m/s), $h_{wake}$ is a wake loss at the blade outlet (m), $\xi$ is an excretion coefficient at the impeller outlet, subscripts g of $Z_g$, $\lambda_g$, $l_{b,g}$, $D_{hyd,g}$ and $\overline{w}_g$ represents the guide blade zone, the meaning of each symbol is consistent with the symbols of the impeller zone, $\lambda_{f,d}$ is a hydraulic frictional resistance coefficient of the diffuser, $\theta_d$ is a diffusion angle of the diffuser (°), $A_{d1}$ and $A_{d2}$ respectively are a flow area of a diffuser inlet and a flow area of a diffuser outlet (m2), $v_{d1}$ and $v_{d1}$ respectively are an average flow velocity of the diffuser inlet and an average flow velocity of the diffuser outlet (m/s), k is a diffuser coefficient and is determined by the size of the diffuser;

I5, calculating an output power $P_{tb}$ of the optimal efficiency point in the power generation mode based on the theoretical hydraulic head and the flow of the optimal efficiency point in the power generation mode:

$$P_{tb} = \rho g Q_{tb} H_{t,th},$$

I6, calculating an actual hydraulic head $H_{tb}$ of the axial-flow PAT at the optimal efficiency point in the power generation mode:

$$H_{tb} = H_{t,th} + \Sigma h_{t,loss},$$

where $\Sigma h_{t,loss}$ is a sum of all hydraulic head losses; and

I7, calculating an optimal efficiency $\eta_{tb}$ based on a ratio of the theoretical hydraulic head to a total hydraulic head:

$$\eta_{tb} = \dfrac{H_{t,th}}{H_{t,th} + \sum h_{t,loss}}.$$

Performance Curve Estimation Method

The present invention further provides a method for estimating a performance curve in an axial-flow PAT power generation mode, where the performance curve is estimated based on the above described estimation method of an optimal efficiency point parameter in an axial-flow PAT power generation mode, and the method includes the following steps:

II1, calculating a normalized flow-hydraulic head curve based on similarity hypothesis of an axial-flow PAT normalized performance curve:

$$h_t = 2.55 q_t^2 - 1.30 q_t - 0.25,$$

where $h_t$ is a normalized hydraulic head, and calculated according to $$h_t = \frac{H_t}{H_{tb}},$$

$H_t$ is a hydraulic head, $H_{tb}$ is an optimal efficiency point hydraulic head, and $q_t$ is a normalized flow rate; according to $$q_t = \frac{Q_t}{Q_{tb}},$$

$Q_t$ is flow rate, and $Q_{tb}$ is the optimal efficiency point flow rate; and a normalized parameter is defined as be a ratio of an actual parameter value to an optimal efficiency point parameter value;

II2, calculating a normalized hydraulic head-output power curve:

$$p_t = 1.27 h_t - 0.27,$$

where $p_t$ is a normalized output power, and according to $$p_t = \frac{P_t}{P_{tb}},$$

$P_t$ is the output power, and $P_{tb}$ is an optimal efficiency point output power; and II3, calculating a hydraulic head-efficiency curve:

$$\eta_t = \frac{p_t}{q_t h_t} \eta_{tb},$$

where $\eta_{tb}$ is optimal efficiency.

The present invention obtains all performance curves, including a head-flow curve, an output power-head curve and an efficiency-head curve, of a specific axial-flow PAT by defining the normalized parameter and performing a reversal treatment on a normalized curve.

In the calculation of the parameters of the optimal efficiency point, the flow rate can be calculated by using the binary theory to analyze and solve the fluid motion, that is, a stream surface of 50% blade-height position is selected to be analyzed; or the fluid movement is analyzed and solved by utilizing a quasi-ternary theory, that is, stream surfaces of N blade-height positions are selected to be analyzed and solved, and the solved N axial velocities conduct weighted average on the overflow area according to their radius positions in order to obtain an average axial velocity.

In the calculation of hydraulic head, a friction coefficient of the frictional hydraulic head loss is calculated according to the Haaland formula, where the wall roughness is selected according to pipe conditions. To an actual PAT unit, the roughness of its blade surfaces and guide blade surfaces generally can be determined according to industrial standards, however, there is no uniform processing standard for the roughness of other parts of the supporting pipeline system, so determination and trial are performed in advance according to the material of the pipeline and the utilization condition, correction is performed by using an optimal efficiency point parameter in a pumping model, and actual roughness is obtained based on multiple trials.

Function and Effect of the Present Invention

Firstly, the optimal efficiency point parameter is the most important fundamental data in all kinds of PAT applications, and is the basis of unit selection in the planning and designing stage. The estimation method provided by the present invention can directly predict each energy parameter of a PAT unit at an operating point. In the existing method, the energy parameters of the optimal efficiency point can be further obtained based on the obtained complete performance curve.

Secondly, the estimation method provided by the invention is based on similarity of the normalized performance curve of the axial-flow PAT, when predicting multiple operating conditions, the method is fast, simple and easy to use, and can flexibly select a predicted operating condition range according to hydrological characteristics.

Thirdly, when the feasibility is also considered, the estimation method provided by the present invention has a great compatibility and can be applied to an axial-flow PAT with the specific velocity 120-300 (the specific velocity is the specific velocity of the optimal efficiency point of the pumping mode, and the formula is $$\frac{n\sqrt{Q}}{H^{3/4}} \Bigg).$$

The present invention has high adaptability and can provide reliable accuracy in an allowed axial-flow PAT operating range.

BRIEF DESCRIPTION OF THE DRAWINGS

FIG. 4 is a schematic diagram of a segment of an axial-flow PAT unit, where (A), (B) and (D) are side views, and (C) is an axial view; that is, an impeller zone is divided into several blade channels according to the number of blades (there are three blades in the figure, so there are three blade channels), parameter calculation of its hydraulic diameter is conducted according to a single blade channel, the final friction loss of the single blade channel is multiplied by the number of the blades so as to obtain a total friction loss of the impeller zone, and calculation method of a friction loss in the guide vane zone is similar;

FIG. 7, FIG. 8 and FIG. 9 are comparison diagrams of a performance curve obtained by the estimation method provided by the present invention and original data, where

DETAILED DESCRIPTION

The following describes specific embodiments of a method for estimating an optimal efficiency point parameter and performance curve in an axial-flow PAT power generation mode according to the present invention in detail with reference to the accompanying drawings.

Embodiment 1

Figure 1:
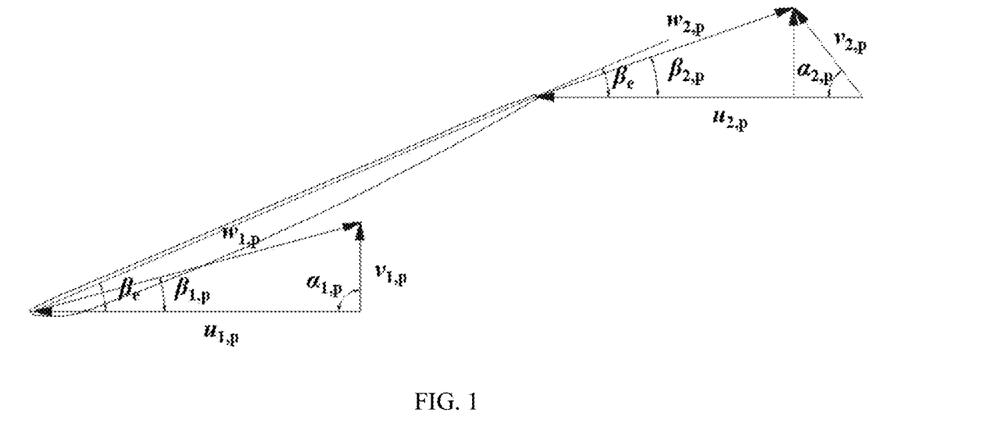
FIG. 1 is a velocity triangle of an inlet and an outlet of an optimal efficiency point in a pumping mode, u represents a circumferential velocity, w represents a relative velocity, v represents an absolute velocity, A represents an airfoil setting angle, a subscript 1 represents an inlet while a subscript 2 represents an outlet, and p represents an operating condition of the pumping mode.
Figure 2:
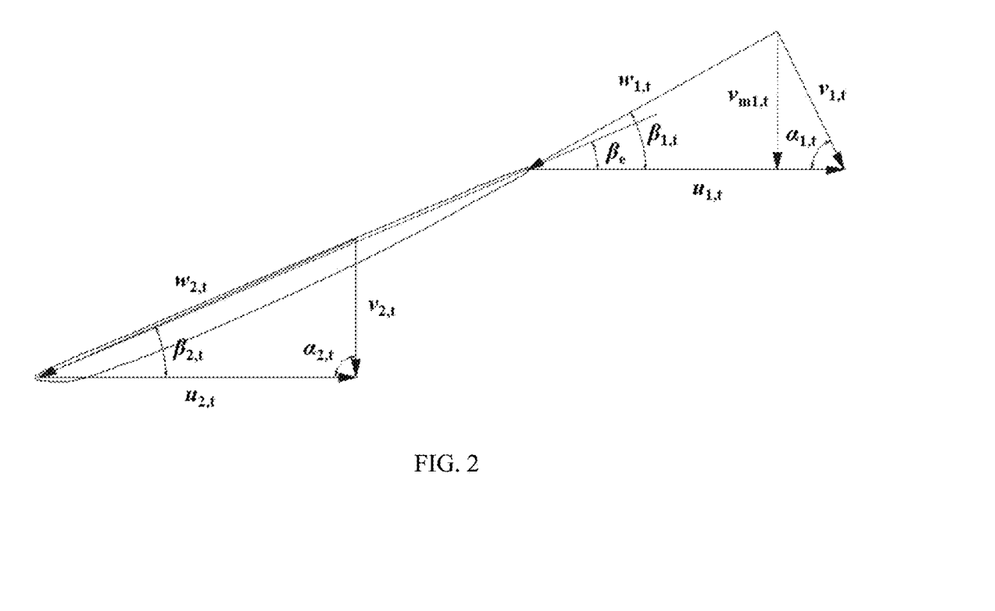
FIG. 2 is a velocity triangle of an inlet and an outlet of an optimal efficiency point in a power generation mode, u represents a circumferential velocity, w represents a relative velocity, v represents an absolute velocity, A represents an airfoil setting angle, a subscript 1 represents an inlet while a subscript 2 represents an outlet, and t represents an operating condition of the pumping mode.
Figure 3:
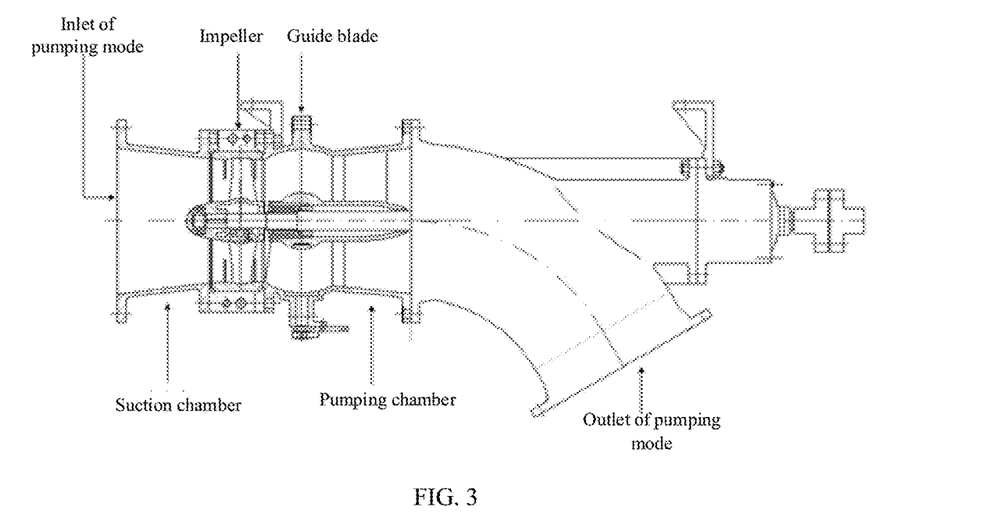
FIG. 3 is a schematic structural diagram of a flow channel of an axial-flow PAT unit.
Figure 4:
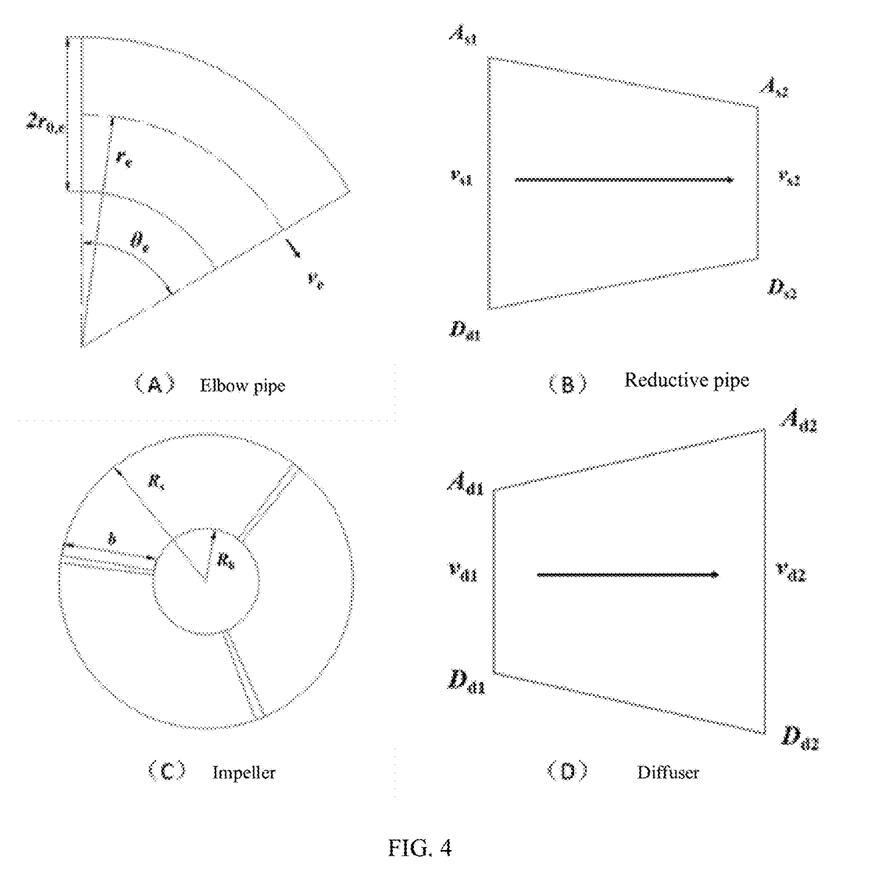
Figure 5:
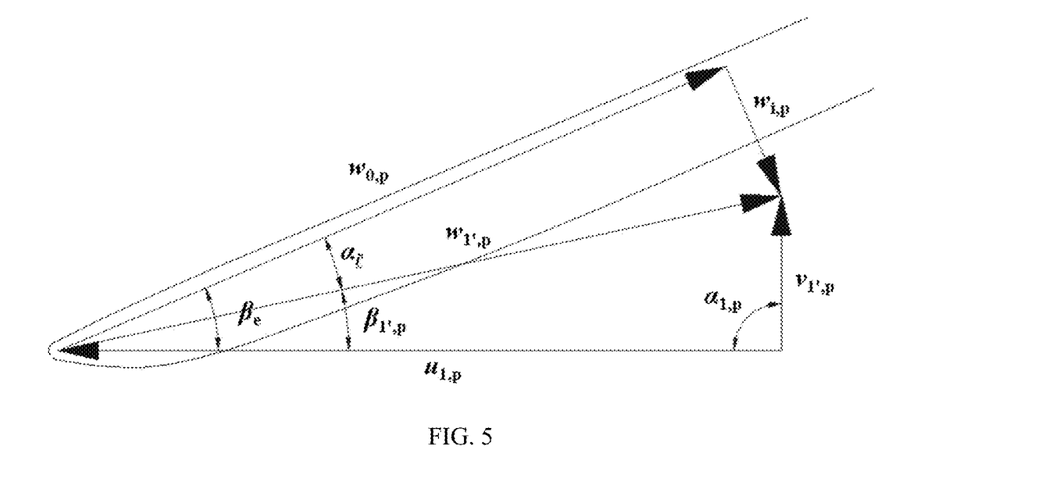
FIG. 5 is a schematic diagram showing decomposition of shock velocity of a blade inlet, that is, a relative velocity w of a fluid is orthogonally decomposed into two components in parallel with a wing chord and in a direction vertical to the wing chord, where a component wi in the direction vertical to the wing chord is the shock velocity.
Figure 6:
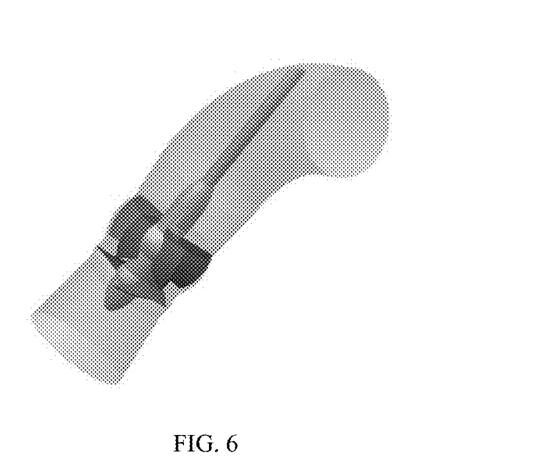
FIG. 6 is a three-dimensional model of an axial-flow PAT.

As shown in FIG. 6, the rotational velocity of an impeller of an axial-flow PAT n is equal to 1450 r/min, the diameter of the impeller D is equal to 0.30 m, the diameter of the hub $d_h$ is equal to 0.108 m, an airfoil setting angle of the impeller A is equal to 23°, a setting angle of a guide blade $\beta_{e.g}$ is equal to 80°, and a radius R of 50% blade-height airfoil is equal to 0.105 m. Energy parameters of an optimal efficiency point in a pumping mode are: the hydraulic head is 3.33 m, the flow rate is 0.326 m³/s, the shaft power is 12.96 kW and the hydraulic efficiency is 82.09%. Energy parameters of an optimal efficiency point in a power generation mode are: the hydraulic head is 4.47 m, the flow rate is 0.457 m³/s, the output power is 16.04 kW and the hydraulic efficiency is 80.09%.

Prediction results by using an optimal efficiency point estimation method provided by the present invention are: the flow rate is 0.471 m³/s (corresponding to the steps I1 and I2), the hydraulic head is 4.29 m (corresponding to the steps I3, I4 and I6), the output power is 15.49 kW (corresponding to the step I5), and the hydraulic efficiency is 78.11% (corresponding to the step I7). Prediction error of each parameter is as follows: the prediction error of the flow rate is 3.06%, the prediction error of the hydraulic head is 4.03%, the prediction error of the hydraulic efficiency is 1.98%, and the prediction error of the output power is 3.43%.

Embodiment 2

Figure 7:
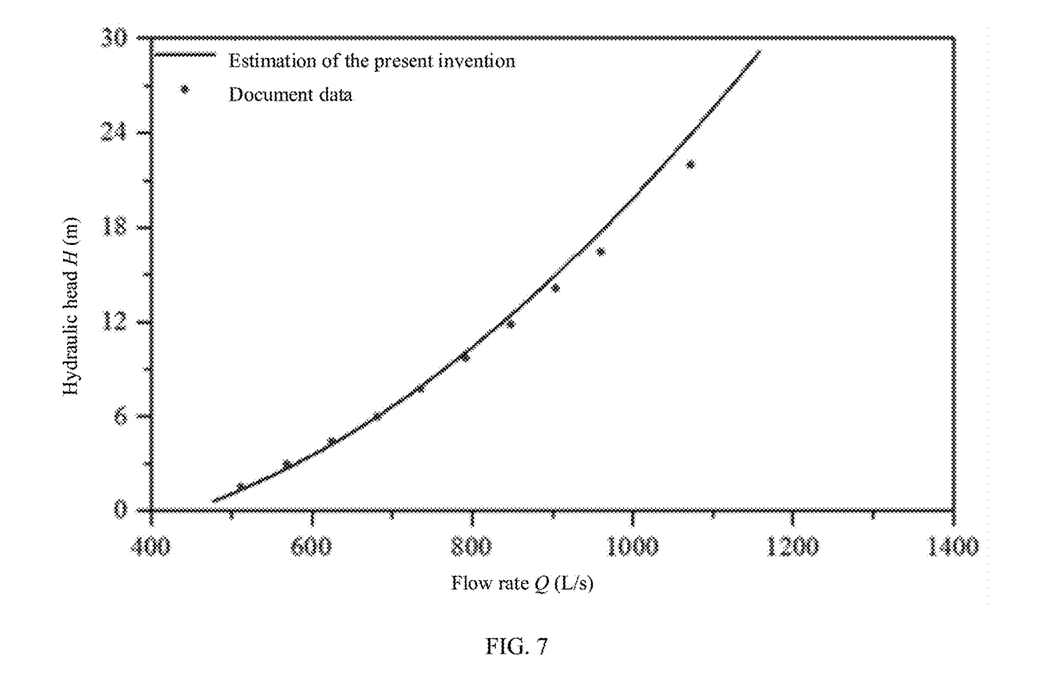
FIG. 7 is a comparison diagram of a hydraulic head-flow curve.
Figure 8:
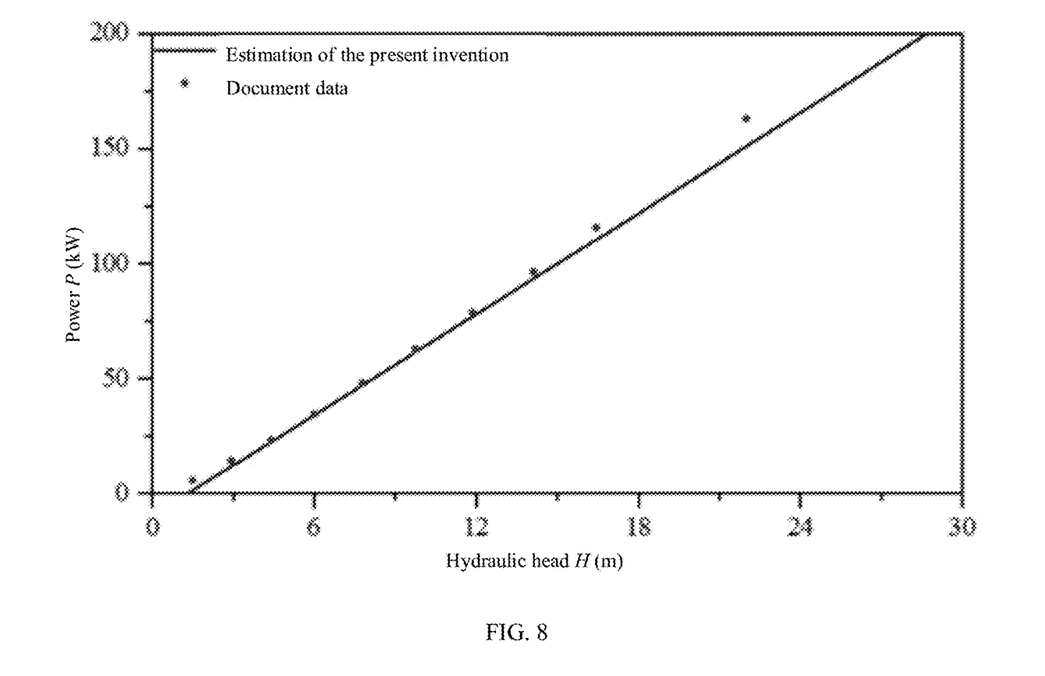
FIG. 8 is a comparison diagram of a hydraulic head-output power curve.
Figure 9:
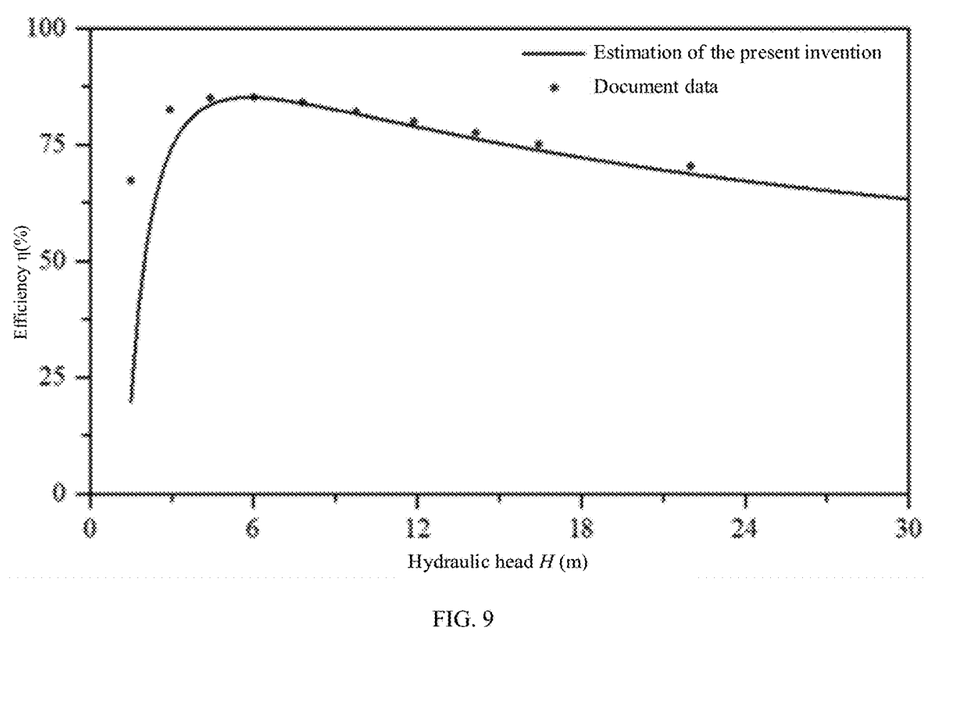
FIG. 9 is a comparison diagram of a hydraulic head-power curve.

The method provided by the present invention is used for predicting a performance curve of a certain axial-flow PAT (corresponding to the steps II1 to II3), and compares the obtained performance curve with the original data, as shown in FIG. 7, and it can be seen that the prediction results of the present invention is consistent with the trend of the original data and is in good agreement. Within the allowable operation range, the average error of the hydraulic head is 5.72%, the average error of the output power is 4.68% and the average error of the hydraulic efficiency is 2.42%.

The above embodiments merely illustrate the technical solution of the present invention. The method for estimating an optimal efficiency point parameter and performance curve in an axial-flow PAT power generation mode associated with the present invention is not only limited to contents described in the above embodiments, but also is subject to a scope defined in the claims. Any modifications, supplementations or equivalent replacements made by a person skilled in the part based on the embodiments shall fall within the protection scope of the present invention.

What is claimed is:

1. A method for estimating optimal efficiency point parameters in an axial-flow pump as turbine power generation mode, wherein the method comprises:
   - I0, obtaining parameters of an axial-flow pump as turbine unit; the parameters comprising a flow rate of the optimal efficiency point in a pumping mode, a radius of an airfoil position, a rotational velocity of an impeller, a diameter of an impeller, a diameter of a hub, an impeller airfoil setting angle, a guide blade setting angle, a circumferential velocity, and a circumferential component of the absolute velocity;
   - I1, calculating an axial velocity $v_{m1,t}$ of an optimal efficiency point in a power generation mode by utilizing the following formula:

$$v_{m1,t} = \frac{1}{\cot\beta_{e,g} + \cot\left(2\beta_e - \arctan\left(\frac{Q_{pb}}{\frac{\pi}{4}(D^2 - d_h^2)} \frac{60}{2\pi n R}\right)\right)} \frac{2\pi n}{60} R,$$

wherein $Q_{pb}$ is the flow rate of the optimal efficiency point in a pumping mode, R is the radius of an airfoil position, n is the rotational velocity of an impeller, D is the diameter of an impeller, $d_h$ is the diameter of a hub, $\beta_e$ is the impeller airfoil setting angle, and $\beta_{e,g}$ is the guide blade setting angle;
   - I2, calculating a flow rate $Q_{tb}$ of the optimal efficiency point in the power generation mode based on the axial velocity of the optimal efficiency point and a flow area:

$$Q_{tb} = \frac{\pi}{4}(D^2 - d_h^2)v_{m1,t},$$

- I3, calculating a theoretical hydraulic head $H_{t,th}$ of an axial-flow pump as turbine:

$$H_{t,th} = \frac{u_{1,t}v_{u1,t}}{g},$$

wherein $u_{1,t}$ is the circumferential velocity, $v_{u1,t}$ is the circumferential component of the absolute velocity, and g is a gravitational acceleration;
   - I4, segmenting a whole flow channel of the axial-flow pump as turbine according to geometrical characteristics, and respectively calculating a frictional hydraulic head loss and a local hydraulic head loss of each segment according to formulas listed in Table 1:

TABLE 1

Formulas for calculating a frictional hydraulic head loss and a local hydraulic head loss of each segment

| Flow passage component | Frictional hydraulic head loss | Local hydraulic head loss |
|---|---|---|
| Elbow pipe | $h_{f,e} = \lambda_{f,e} \dfrac{\theta_e \pi}{360} \cdot \dfrac{r_e}{r_{0,e}} \cdot \dfrac{v_e^2}{2g}$ | $h_{d,e} = \left[0.131 + 1.847\left(\dfrac{r_{0,e}}{r_e}\right)^{3.5}\right]\left(\dfrac{\theta_e}{90}\right)\dfrac{v_e^2}{2g}$ |
| Reductive pipe | $h_{f,s} = \lambda_{f,s} \dfrac{1}{8\sin(\theta_s/2)} \cdot \left[1 - \left(\dfrac{A_{s2}}{A_{s1}}\right)^2\right] \cdot \dfrac{v_{s2}^2}{2g}$ | $h_{d,s} = \xi_s \dfrac{v_{s2}^2}{2g}$ |
| Guide blade zone | $h_{f,g} = Z_g \lambda_g \dfrac{l_{b,g}}{D_{hyd,g}} \dfrac{\overline{w}_g^2}{2g}$ | $h_{shock,g} = 0.7 \dfrac{w_{i,g}^2}{2g}$ <br><br> $h_{wake,g} = (1-\xi_g)^2 \dfrac{\overline{w}_g^2}{2g}$ |
| Impeller zone | $h_f = Z\lambda \dfrac{l_b}{D_{hyd}} \dfrac{\overline{w}^2}{2g}$ | $h_{shock} = 0.7 \dfrac{w_i^2}{2g}$ <br><br> $h_{wake} = (1-\xi)^2 \dfrac{\overline{w}^2}{2g}$ |
| Diffuser | $h_{f,d} = \lambda_{f,d} \dfrac{1}{8\sin(\theta_d/2)} \cdot \left[\left(\dfrac{A_{d2}}{A_{d1}}\right)^2 - 1\right] \cdot \dfrac{v_{d2}^2}{2g}$ | $h_{d,d} = k\left(\dfrac{A_{d2}}{A_{d1}} - 1\right)^2 \cdot \dfrac{v_{d2}^2}{2g}$ | wherein $\lambda_{f,e}$ is a hydraulic frictional resistance coefficient of the elbow pipe, $\theta_e$ is a bend angle of the elbow pipe, $r_e$ is a radius of the elbow center line, $r_{0,c}$ is a radius of the elbow pipe, $v_e$ is an average flow velocity of the elbow pipe, $A_{f,s}$ is a hydraulic frictional resistance coefficient, $\theta_s$ is a convergence angle, $A_{s1}$ and $A_{s2}$ are respectively a flow area of an inlet of the reductive pipe and a flow area of an outlet of the reductive pipe, $v_{s1}$ and $v_{s2}$ are respectively an average flow velocity of the inlet of the reductive pipe and an average flow velocity of the outlet of the reductive pipe, $\xi_s$ is a local loss coefficient, $h_f$ is a frictional hydraulic head loss in an impeller flow channel, Z is the number of impeller blades, $\lambda$ is a hydraulic frictional resistance coefficient, $l_b$ is a length of the impeller flow channel, $D_{hyd}$ is an equivalent hydraulic diameter of the impeller flow channel, $\overline{w}$ is an average relative velocity of the impeller flow channel:

$$\overline{w} = \sqrt{\dfrac{(w_{1',p}^2 + w_{2',p}^2)}{2}},$$

$w_{1',p}$ is a relative velocity of a blade inlet, $w_{2',p}$ is a relative velocity of a blade outlet, $h_{shock}$ is a fluid shock loss of the blade inlet, $w_i$ is a fluid shock velocity of the blade inlet, $h_{wake}$ is a wake loss of the blade outlet, $\xi$ is an excretion coefficient of the impeller outlet, subscripts g in $Z_g$, $\lambda_g$, $l_{b,g}$, $D_{hyd,g}$ and $\overline{w}_g$ represent the guide blade zone, the meaning of the other symbol is consistent with the symbols of the impeller zone, $\lambda_{f,d}$ is a hydraulic frictional resistance coefficient of the diffuser, $O_d$ is a diffusion angle of the diffuser, $A_{d1}$ and $A_{d2}$ are respectively a flow area of a diffuser inlet and a flow area of a diffuser outlet, $v_{d1}$ and $v_{d2}$ are respectively an average flow velocity of the diffuser inlet and an average flow velocity of the diffuser outlet, and k is a diffuser coefficient;

I5, calculating an output power $P_{tb}$ of the optimal efficiency point in the power generation mode based on the theoretical hydraulic head and the flow rate of the optimal efficiency point in the power generation mode:

$$P_{tb} = \rho g Q_{tb} H_{t,th},$$

I6, calculating an actual hydraulic head $H_{tb}$ of the axial-flow pump as turbine at the optimal efficiency point in the power generation mode:

$$H_{tb} = H_{t,th} + \Sigma h_{t,loss},$$

wherein $\Sigma h_{t,loss}$ is a sum of all hydraulic head losses; and

I7, calculating an optimal efficiency $\eta_{tb}$ based on a ratio of the theoretical hydraulic head to a total hydraulic head:

$$\eta_{tb} = \dfrac{H_{t,th}}{H_{t,th} + \Sigma h_{t,loss}}.$$

I8, performing Pump as turbine unit selection based on the low rate at an optimal efficiency point in the power generation mode, the output power at the optimal efficiency point in the power generation mode, the actual hydraulic head of the axial-flow pump as turbine at the optimal efficiency point in the power generation mode and the optimal efficiency.

2. A method for estimating a performance curve in an axial-flow pump as turbine power generation mode, wherein the performance curve is estimated based on the above described estimation method of an optimal efficiency point parameter in an axial-flow pump as turbine power generation mode according to claim 1, and the estimation method comprises:

II1, calculating a normalized flow-hydraulic head curve based on similarity hypothesis of an axial-flow pump as turbine normalized performance curve:

$h_t = 2.55 q_t^2 - 1.30 q_t - 0.25$, wherein $h_t$ is a normalized hydraulic head, and calculated according to $$h_t = \frac{H_t}{H_{tb}},$$

$H_t$ is a hydraulic head, $H_{tb}$ is an optimal efficiency point hydraulic head, and $q_t$ is a normalized flow rate; and according to $$q_t = \frac{Q_t}{Q_{tb}},$$

$H_t$ is a flow rate, and $Q_{tb}$ is an optimal efficiency point flow rate;

I12, calculating a normalized hydraulic head-output power curve:

$p_t = 1.27 h_t - 0.27$, wherein $p_t$ is a normalized output power, and according to $$p_t = \frac{P_t}{P_{tb}},$$

$P_t$ is the output power, and $P_{tb}$ is an optimal efficiency point output power; and I13, calculating a hydraulic head-efficiency curve:

$$\eta_t = \frac{p_t}{q_t h_t} \eta_{tb},$$

wherein $\eta_{tb}$ is optimal efficiency.

* * * * *